United States Patent [19]

Koizumi et al.

[11] Patent Number: 5,034,782
[45] Date of Patent: Jul. 23, 1991

[54] SEMICONDUCTOR COMMUTATOR WITH GRAIN BOUNDARY

[75] Inventors: Toru Koizumi, Tokyo; Hidemasa Mizutani, Sagamihara, both of Japan

[73] Assignee: Canon Kabushiki Kaisha, Tokyo, Japan

[21] Appl. No.: 422,762

[22] Filed: Oct. 17, 1989

[30] Foreign Application Priority Data

Oct. 20, 1988 [JP] Japan .................. 63-262930

[51] Int. Cl.⁵ .................................. H01L 29/90
[52] U.S. Cl. ........................ 357/13; 357/60; 357/59
[58] Field of Search ............ 357/13, 60, 63, 64, 357/30 P, 59 A, 59 K, 59 G, 2

[56] References Cited

U.S. PATENT DOCUMENTS

| | | | |
|---|---|---|---|
| 3,518,503 | 6/1970 | Doo | 357/59 A X |
| 3,900,943 | 8/1975 | Sirtl et al. | 29/576 |
| 4,062,038 | 12/1977 | Cuomo et al. | 357/60 X |
| 4,178,197 | 12/1979 | Marinace | 357/60 X |
| 4,259,683 | 3/1981 | Adler et al. | 357/64 |
| 4,626,883 | 12/1986 | Kash et al. | 357/60 X |
| 4,646,427 | 3/1987 | Doyle | 29/586 |

FOREIGN PATENT DOCUMENTS 61-78447  4/1986  European Pat. Off. .
0244081  11/1987  European Pat. Off. .
60-16466  1/1985  Japan .

*Primary Examiner*—William Mintel
*Attorney, Agent, or Firm*—Fitzpatrick, Cella, Harper & Scinto

[57] ABSTRACT

A semiconductor commutator is provided with first and second semiconductor regions joined at a junction formed therebetween. The first semiconductor region is of the first conductivity type at the second semiconductor region is of the opposite conductivity type. A grain boundary is provided near the junction and within a region, through which a carrier passes, between electrodes respectively provided on the semiconductor regions.

8 Claims, 5 Drawing Sheets

SEMICONDUCTOR COMMUTATOR WITH GRAIN BOUNDARY

BACKGROUND OF THE INVENTION

1. Field of the Invention

The present invention relates to a semiconductor commutator and, more particularly, to a semiconductor commutator which is constructed by joining a semiconductor region of the first conductivity type and a semiconductor region of the second conductivity type.

2. Related Background Art

In a PN junction diode, improvement in switching speed is strongly demanded. However, in a PN junction diode using a monocrystal, since a carrier life time in bulk is long, when switching from the ON state to the OFF state, excessive minority carriers remain, so that the delay time for switching becomes long and there is a limitation in improvement of the switching speed.

Hitherto, in order to improve the switching speed, heavy metal, for instance, gold is used as a recombination center for a PN diode or a PN junction diode is formed on a polycrystalline semiconductor layer and a grain boundary defect is used as a recombination center, thereby reducing the life time of the minority carriers and decreasing the delay time.

However, in the above conventional example, in the case of using gold as a recombination center, there is a problem such that field concentration occurs in gold atoms. On the other hand, in the case of using a grain boundary defect as a recombination center, there is a problem such that since impurities are segregated in the grain boundary near a high concentration layer, field concentration occurs in the grain boundary which crosses the junction surface.

Thus, electric field breakdown occurs and a dark current component increases from a grain boundary within a depletion layer as a generation center. That is, since a particle size of polycrystalline silicon is very small, there is no limitation in a position of the particles. Therefore, when the boundary defect is used as the recombination center, the position of the grain boundary is an optional one within whole element.

Many boundaries are within and in the vicinity of the high concentration layer. As a result, at the grain boundary, impurities are segregated, which adversely effects the element property. Such phenomena will now be practically described.

FIG. 1 shows the current to voltage characteristics of a PN junction diode. In the diagram, a solid curve indicates the ideal preferable characteristics. However, actually, since a dark current component is caused due to the electric field breakdown, the characteristics become as shown by a broken line.

SUMMARY OF THE INVENTION

An object of the present invention is to provide a semiconductor commutator capable of high speed operation and an excellent current-voltage property.

Another object of the present invention is to provide a semiconductor commutator which is constructed by joining a semiconductor region of the first conductivity type and a semiconductor region of the second conductivity type, wherein a grain boundary is provided near the junction surface of the semiconductor region of the first conductivity type and the semiconductor region of the second conductivity type so as not to cross the junction surface.

A semiconductor commutator of the invention exhibits the current to voltage characteristics in which the commutator can operate at a high speed and the life time of minority carriers is reduced by effectively using a grain boundary defect, as a recombination center, in which a grain boundary is arranged between a junction surface and an electrode so as not to cross the junction surface.

Still another object of the present invention is to provide a commutator wherein a crystal forming process is executed to a substrate having a non-nucleus forming surface whose nucleus forming density is small and a free surface which has an enough small area so that only a single nucleus to be grown into single crystal is formed and on which a plurality of nuclei forming surfaces each having a nucleus forming density larger than the nucleus forming density of said non-nucleus forming surface are adjacently arranged at a predetermined distance away from one another, a monocrystal is grown from the single nucleus of each of said plurality of nucleus forming surfaces which are arranged at the predetermined distance away from one another, and the grain boundary is formed at the position where said monocrystals are joined.

DETAILED DESCRIPTION OF THE PREFERRED EMBODIMENTS

An embodiment of the invention will be described in detail hereinbelow with reference to the drawings.

First, manufacturing steps to form a crystal substrate having a grain boundary which is used in a semiconductor commutator of the embodiment of the invention will be described.

For instance, a crystal growing method disclosed in E.P. Application Publication No. 0,244,081 can be used.

FIGS. 5A to 5E are vertical sectional views showing an example of the manufacturing steps to form a crystal substrate which is used in the semiconductor commutator in the embodiment of the invention.

Figure 5A:
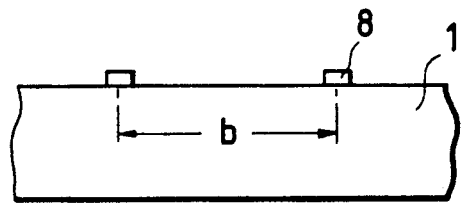
FIGS. 5A to 5E are respectively schematic vertical sectional views showing manufacturing steps to form a crystal substrate which is used in the semiconductor commutator of the embodiment of the invention.
Figure 6:
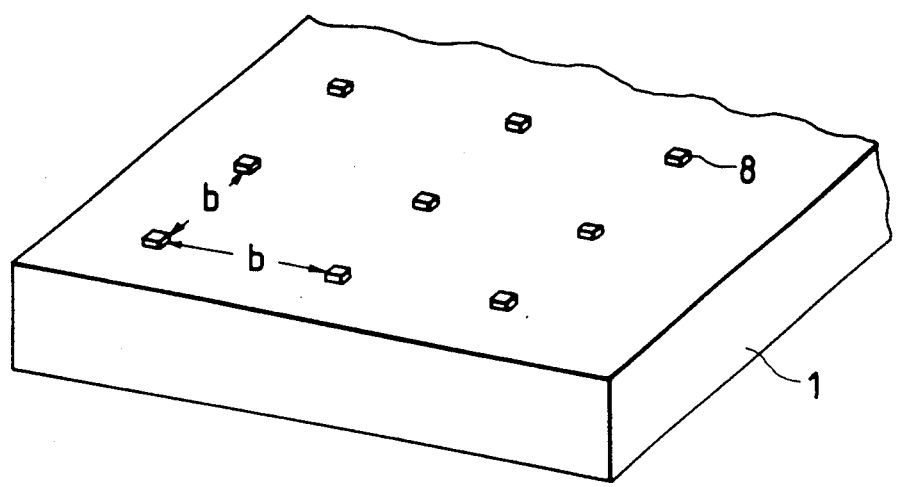
FIG. 6 is a schematic perspective view showing an $Si_3N_4$ film formed on an $SiO_2$ film.

FIG. 6 is a perspective view showing an $Si_3N_4$ film formed on an $SiO_2$ film and corresponds to the manufacturing step shown in FIG. 5A.

First, as shown in FIGS. 5A and 6, $SiO_2$ film 1 having a thickness of 2000 Å serving as a non-nucleus forming surface is formed on a silicon wafer of (100) by using a thermal oxidation process. An $Si_3N_4$ film of 300 Å is deposited onto the $SiO_2$ film 1. Furthermore, the $Si_3N_4$ film is patterned by using a well-known fine processing technique in a manner such that nuclei each having a size of 2 $\mu m\square$ are arranged at an interval b (in this case, b=100 $\mu m$). A resultant $Si_3N_4$ film 8 serving as a nucleus forming surface which was formed is hereinafter called a site.

Figure 5B:
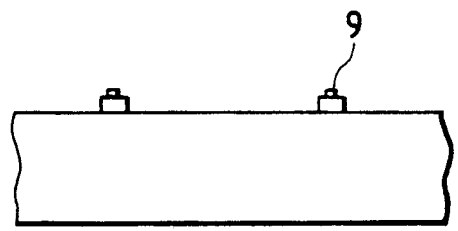

Next, as shown in FIG. 5B, by executing a vapor phase growing process of the $SiH_2Cl_2/HCl/H_2/PH_3$ system, a crystal nucleus of Si can be formed only in the site 8 since the nucleus forming concentration of $Si_3N_4$ is larger than that of $SiO_2$. If the size of the site 8 is set to be sufficiently small, only one crystalline nucleus 9 of Si to be grow into single crystalline silicon can be formed in the single site 8.

Figure 5C:
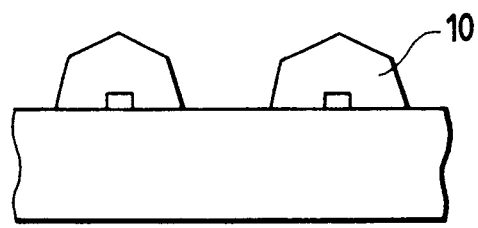

Next, as shown in FIG. 5C, when crystal is subsequently grown, only one crystalline nucleus 9 on each site 8 continuously grows, an Si monocrystalline grain 10 is formed, and the Si monocrystalline grain 10 can be further grown.

Figure 5D:
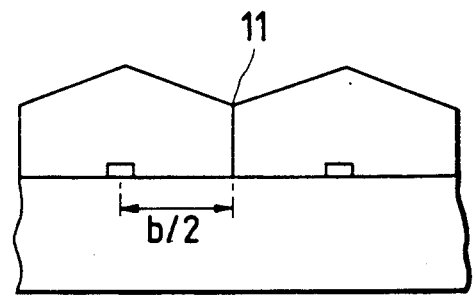

Next, as shown in FIG. 5D, the Si monocrystalline grains 10 which grew from both of the adjacent sites 8 are joined at the center between the sites 8, thereby forming a grain boundary 11. As shown in the diagram, the grain boundary 11 is formed in the direction perpendicular to the substrate.

Figure 5E:
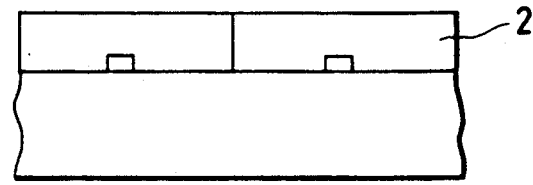

Then, as shown in FIG. 5E, the substrate on which the grain boundary 11 was formed by joining the Si monocrystalline grains 10 is flattened until a thickness of crystalline layer becomes 2 $\mu m$, thereby forming a monocrystalline layer 2. Thus, an n type silicon crystalline substrate in which the position of the grain boundary was controlled like a lattice of an interval of 100 $\mu m$ and a phosphorus (P) concentration is set to $1\times10^{16}$ atom/cm$^3$ was obtained.

In the invention, the crystalline substrate in which the position of the grain boundary was controlled is a significant component member and, preferably, it can be formed by using the crystal growing method disclosed in the E.P. Application Publication No. 0,244,081 mentioned above. However, the invention is not limited to such a method but any other preferable methods can be also used, if a grain boundary position can be controlled by the methods.

The semiconductor commutator of the invention can be manufactured as follows by using the n type silicon crystalline substrate formed by the manufacturing steps described above.

(Embodiment 1)

Figure 2:
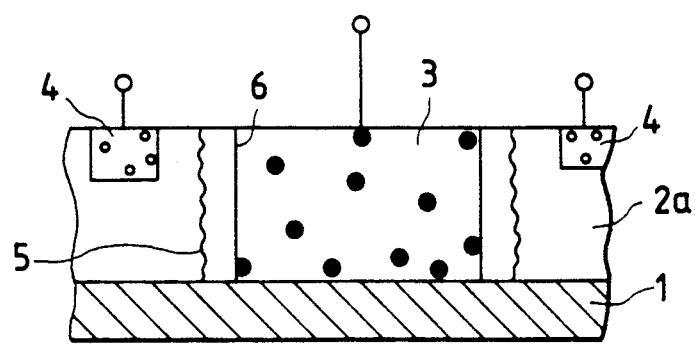
FIG. 2 is a schematic partial cross-sectional view illustrating a construction of a semiconductor commutator of an embodiment 1 of the invention.

FIG. 2 is a partial cross-sectional view illustrating a construction of a semiconductor commutator of the embodiment 1 of the invention.

Figure 3:
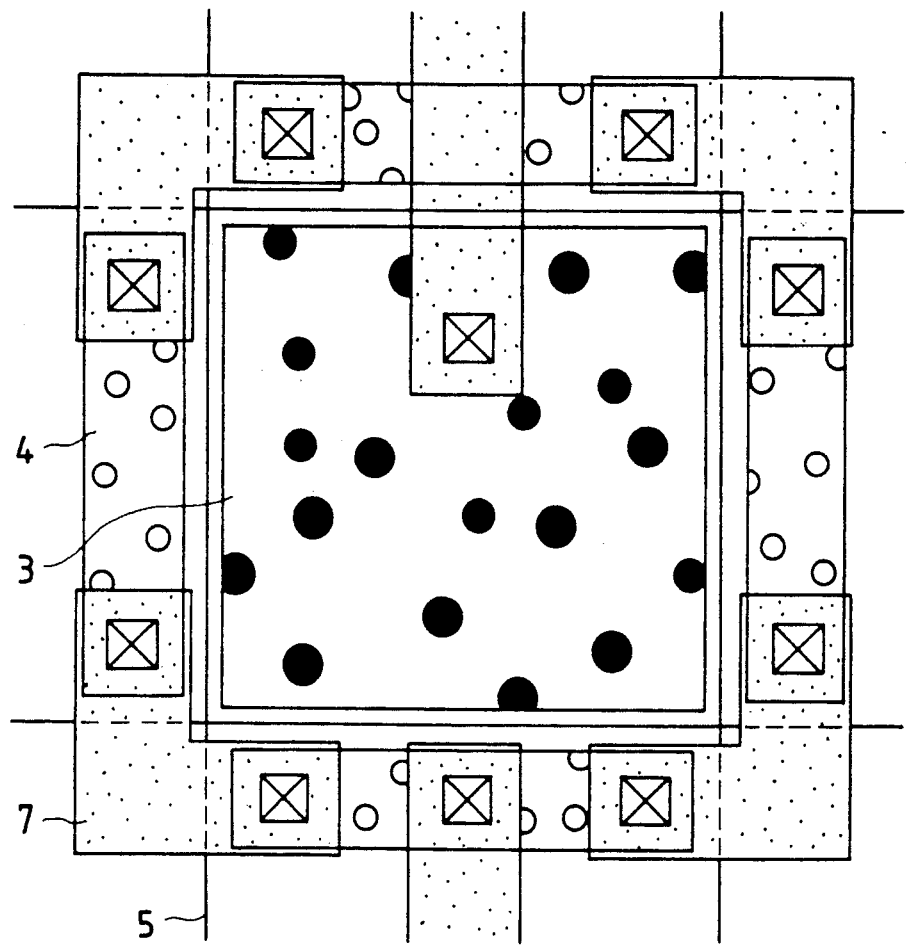
FIG. 3 is a schematic partial plan view of the semiconductor commutator.

FIG. 3 is a partial plan view of the semiconductor commutator.

Figure 4:
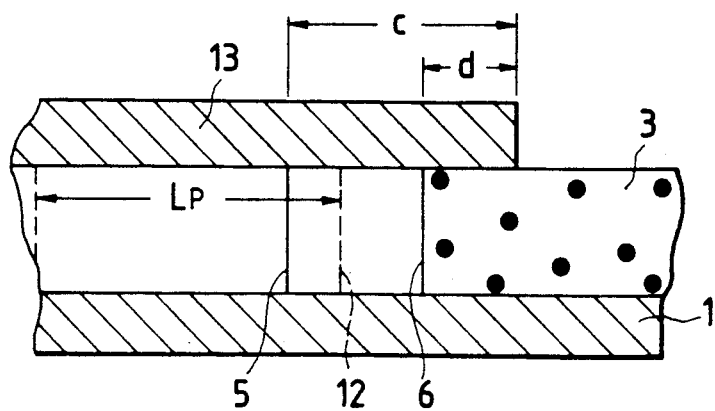
FIG. 4 is a schematic partial cross sectional view illustrating an arrangement of a grain boundary of the semiconductor commutator.

FIG. 4 is a partial cross-sectional view illustrating an arrangement of a grain boundary of the semiconductor commutator.

The semiconductor commutator illustrated in FIG. 4 was formed by the following process. First, on the n type silicon crystalline substrate, $SiO_2$ film with a thickness of 5000 Å is formed. Next, in order to form a high impurity concentration region within only a desired single crystal grain in the single crystal layer 2, a portion of the $SiO_2$ film corresponding to the single crystalline grain is removed. In the present embodiment, the portion of $SiO_2$ 93 $\mu m$ square was removed. Next, using $SiO_2$ film as a mask, BN diffusion is conducted at a temperature 100° C. for 2 hours, thereby an impurity diffusion layer is extend to under layer (silicon wafer in the present embodiment). A high impurity p type semiconductor region 3 as shown in FIG. 2 is formed. The state of this is described with reference to FIG. 4 as follows.

In FIG. 4, reference numeral 13 denotes a BN diffused oxide film for masking. c indicates a distance from a grain boundary 5 to the edge portion of the $SiO_2$ film (in this case, about 3.5 $\mu m$) and d represents a distance of the diffusion in the lateral direction by the BN diffusion (in this case, about 1.4 $\mu m$ and corresponds to about 70% of the depth). The main surface on which the p type semiconductor region 3 and an n type semiconductor region 2a were flattened and the grain boundary 5 are perpendicularly formed almost in parallel with a junction surface 6.

In order to form an n+ type semiconductor region 4 to come into contact with the n type monocrystalline grain (n type semiconductor region 2a) adjacent to the monocrystalline grain in which the p+ type semiconductor region 3 is formed, a thermal oxide film having a thickness of 4000 Å is formed. Thereafter, the $SiO_2$ film is selectively eliminated, a PSG film having a thickness of 4000 Å is deposited by an A-CVD process, a heat treatment is executed at 900° C. for 30 minutes, and impurities (P) are diffused. As shown in FIG. 3, contact holes are formed and aluminum (Al) is evaporation deposited as electrodes. An $SiO_2$ film having a thickness of 1000 Å is deposited as a protective film.

It should be noted here that, as shown in FIG. 4, the grain boundary 5 exists in a region from a depletion edge 12 to a position of a diffusion length $L_p$ ($L_p$ denotes a diffusion length of a hole). In the embodiment, the diffusion length $L_p$ is set to about up to 5 $\mu m$ and the junction surface 6 exists at a position which is about 2 $\mu m$ away from the grain boundary 5 by when considering also the diffusion distance d in the lateral direction due to the BN diffusion. On the other hand, since a depletion layer width is set to about 1 $\mu m$ at 20 volts, as shown in FIG. 4, the grain boundary 5 is located within the diffusion length $L_p$ from the depletion edge 12.

In the embodiment, a number of excessive minority carriers exist in the region from the depletion edge 12 to the diffusion length $L_p$ and the recombination center existing in such a region most effectively functions. Therefore, even if the number of defects existing in this region is not so large, the switching operation can be executed at a high speed. That is, according to the invention, there is provided a semiconductor commutator which can operate at a high speed and has good current to voltage characteristics by effectively using a grain boundary defect, as a recombination center, in which a grain boundary is arranged between the junction surface and the electrode so as not to cross the junction surface.

It is considered that the defect level of the grain boundary defect exists at the center than 0.2 eV of gold, and the grain boundary defect functions as a more effective recombination center than gold. That is a level which most effectively operates, as the recombination center is one at a middle of the bandgap. A level of gold is at 0.2 eV from the midst of two bandgaps, while, since the defect level of the grain boundary is at the midst, the defect energy level effectively acts as the recombination center rather than that of the gold. Since its concentration lies within a range about from $10^{12}/cm^2$ to $10^{13}/cm^2$, it corresponds to $10^{17}/cm^3$ or more in the case where gold is used as a recombination center. Thus, the current density in the reverse direction is set to up to $10^{-8}$ Å and this value is not so different from that of the commutator formed on the monocrystalline substrate obtained by a Cz method.

Figure 9:
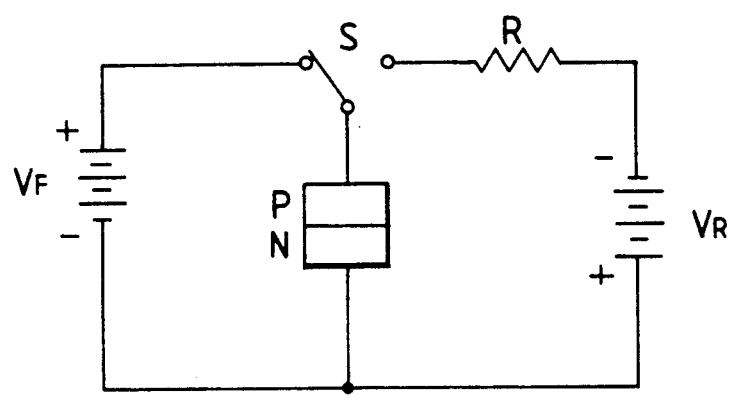
FIG. 9 is a circuit diagram showing a circuit which is used to measure a recovery time in the reverse direction of the semiconductor commutator of the embodiment of the invention.

The semiconductor commutator of the embodiment exhibits the good I-V characteristics of the low dark current. An external circuit is set such that $$\frac{I_F(V_F)}{V_R/R} \sim 100$$

by using a circuit shown in FIG. 9 and the recovery time in the reverse direction was measured. Thus, the high speed switching characteristics of up to 5 nsec were obtained.

(Embodiment 2)

The embodiment relates to the case where the semiconductor commutator in the embodiment 1 mentioned above was two-dimensionally arranged.

Figure 7:
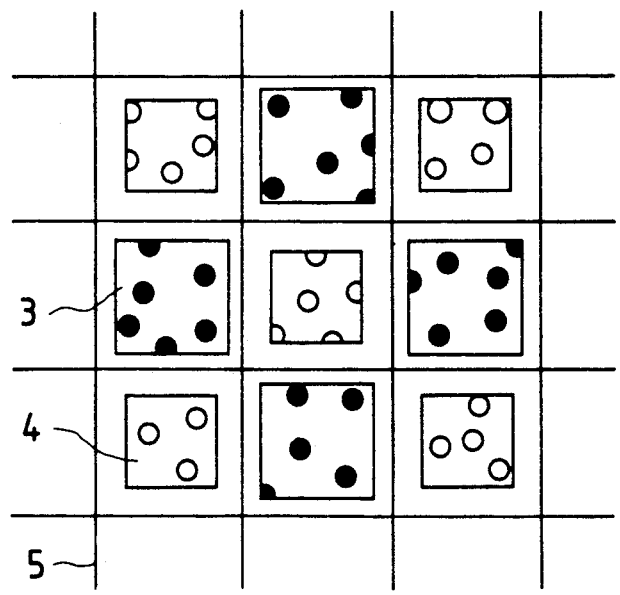
FIG. 7 is a schematic partial plan view showing a construction of a semiconductor commutator of an embodiment 2 of the invention.

FIG. 7 is a partial plan view showing a construction of a semiconductor commutator in the embodiment 2 of the invention.

Figure 8:
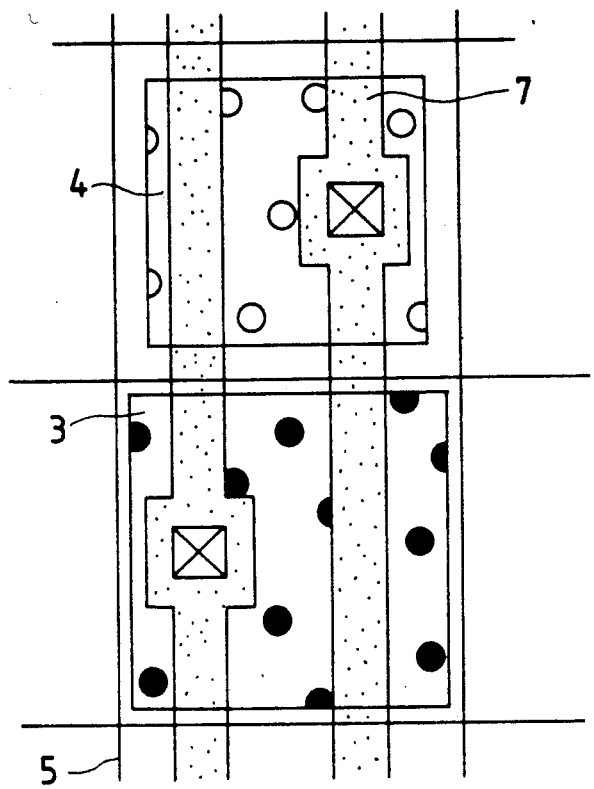
FIG. 8 is a schematic partial plan view showing a wiring state of the semiconductor commutator of the embodiment 2 of the invention.

FIG. 8 is a partial plan view showing a wiring state of the semiconductor commutator.

As shown in FIG. 7, in the embodiment, P type semiconductor regions and N type semiconductor regions are alternately arranged like a zigzag pattern with respect to the columns and rows. FIG. 7 shows a part of the arrangement of the matrix of 10 rows × 10 columns.

The semiconductor commutator of the embodiment can be also formed by using the crystal growing method disclosed in E.P. Application Publication No. 0,244,081 in a manner similar to the embodiment 1. The $SiClH_2/H_2/HCl$ system is used as a material gas system and the crystalline layer is grown until a single crystalline grain diameter becomes 50 μm. Thereafter, it is flattened until a thickness of monocrystalline layer becomes 2 μm.

Then, under the conditions similar to those in the embodiment 1, after a P+ layer and an N+ layer were formed, contact holes and Al wirings are formed and an $SiO_2$ layer having a thickness of 10000 Å is further deposited as a protective film by a sputtering method.

In the embodiment 1, since a larger junction area than the area which is occupied by the device cannot be obtained, there will be a case that the embodiment 1 cannot cope with the case where a relatively large current is needed. However, in the embodiment 2, by arranging the N and P type semiconductor regions like a zigzag pattern, a current value which is two or more times as large as that in the embodiment 1 can be obtained by the same area. Therefore, by using such an arrangement, a semiconductor commutator having a large junction area can be also manufactured in a small space.

Figure 1:
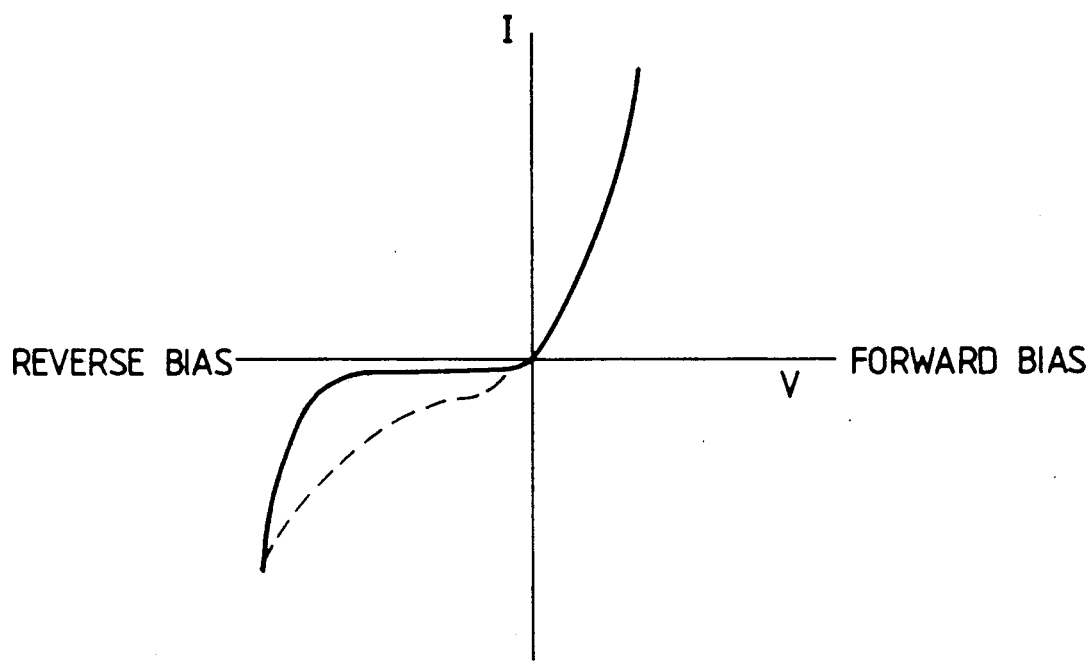
FIG. 1 is a graph showing the current to voltage characteristics of a PN junction diode.

The semiconductor commutator obtained in the embodiment exhibits the good I/V characteristics as shown by a solid line in FIG. 1. An external circuit is set such that the switching speed becomes.

$$\frac{I_F(V_F)}{V_R/R} \sim 100$$

by using the circuit shown in FIG. 9. The recovery time in the reverse direction was measured. Thus, the high speed switching characteristics of up to 5 nsec were obtained.

As described in detail above, according to the semiconductor commutator of the invention, it is possible to realize the semiconductor commutator in which the good I-V characteristics are obtained and the recovery time in the reverse direction has a value on the order of nsec and which can operate at a high speed.

We claim:

1. A semiconductor commutator comprising:
   a first monocrystalline semiconductor region of a first conductivity type;
   a second monocrystalline semiconductor region of a second conductivity type opposite to the first conductivity type, said second semiconductor region being joined with said first semiconductor region to define a junction therebetween; and
   a grain boundary being provided near the junction of said first semiconductor region and said second semiconductor region so as not to cross said junction surface, wherein said grain boundary is disposed in a region, through which a carrier passes, between electrodes respectively provided on said first and second semiconductor regions.

2. A commutator according to claim 1, wherein a main surface of at least one of said first and second semiconductor regions and said grain boundary are formed perpendicular to each other.

3. A commutator according to claim 1, wherein said grain boundary is formed in a lattice configuration and said first and second semiconductor regions are arranged in a zigzag configuration.

4. A commutator according to claim 1, wherein said grain boundary is within said first conductivity type semiconductor region.

5. A commutator according to claim 4, wherein the first conductivity type is n-type.

6. A commutator according to claim 1, wherein said grain boundary is within said second semiconductor region.

7. A commutator according to claim 1, wherein said grain boundary is positioned in a region ranging from a depletion edge of a depletion region due to the junction between said first and second semiconductor regions to a diffusion length ($L_p$).

8. A commutator according to claim 7, wherein the diffusion length ($L_p$) is a diffusion length of a hole.

* * * * *